(12) United States Patent
Sakurai et al.

(10) Patent No.: US 10,296,034 B2
(45) Date of Patent: May 21, 2019

(54) NEGATIVE POWER SUPPLY CONTROL CIRCUIT AND POWER SUPPLY DEVICE

(71) Applicants: Kohei Sakurai, Atsugi (JP); Yoichi Takano, Hadano (JP)

(72) Inventors: Kohei Sakurai, Atsugi (JP); Yoichi Takano, Hadano (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/020,948

(22) Filed: Jun. 27, 2018

(65) Prior Publication Data
US 2019/0004558 A1 Jan. 3, 2019

(30) Foreign Application Priority Data
Jun. 30, 2017 (JP) .................. 2017-128264

(51) Int. Cl.
| | |
|---|---|
| *G05F 3/26* | (2006.01) |
| *G05F 1/10* | (2006.01) |
| *G09G 3/20* | (2006.01) |
| *H03K 17/22* | (2006.01) |
| *H02M 3/07* | (2006.01) |
| *H03K 17/12* | (2006.01) |
| *H03F 3/45* | (2006.01) |

(52) U.S. Cl.
CPC ............... *G05F 3/26* (2013.01); *G05F 1/10* (2013.01); *G09G 3/20* (2013.01); *H02M 3/07* (2013.01); *H03K 17/122* (2013.01); *H03K 17/22* (2013.01); *H03F 3/45071* (2013.01)

(58) Field of Classification Search
CPC ..... G05F 3/10; G05F 3/16; G05F 3/20; G05F 3/26; G05F 3/262; G05F 3/265; G05F 3/267; H03K 17/10; H03K 17/102; H03K 17/12; H03K 17/122; H03K 17/16; H03K 17/161; H03K 17/302; H03K 19/00315; H03K 19/00361
USPC .......................... 323/312–317; 327/108–112
See application file for complete search history.

(56) References Cited

U.S. PATENT DOCUMENTS

| 6,919,743 B2* | 7/2005 | Tobita .................. G09G 3/3688 326/62 |
| 2009/0160498 A1* | 6/2009 | Nakahara ............. H03K 17/063 327/109 |

FOREIGN PATENT DOCUMENTS

JP 2012063849 A 3/2012

\* cited by examiner

*Primary Examiner* — Nguyen Tran
(74) *Attorney, Agent, or Firm* — Holtz, Holtz & Volek PC (57) ABSTRACT

A negative power supply control circuit which controls a negative voltage regulator circuit based on a positive voltage control signal, the negative power supply control circuit including: a control signal input terminal a negative voltage input terminal; a negative voltage input control signal output terminal; a voltage current conversation circuit; a first current source; and a first clamp circuit, wherein the first clamp circuit clamps a voltage at a first intermediate point between the first clamp circuit and the first current source by limiting a current flowing in the first clamp circuit according to the voltage at the first intermediate point in a period when a current flows in the voltage current conversation circuit, and the negative voltage controls signal is generated based on a voltage or a current in a current path through the voltage current conversation circuit, the first clamp circuit and the first current source.

9 Claims, 7 Drawing Sheets

NEGATIVE POWER SUPPLY CONTROL CIRCUIT AND POWER SUPPLY DEVICE

BACKGROUND OF THE INVENTION

1. Field of the Invention

The present invention relates to a negative power supply control circuit which controls a negative voltage regulator circuit with a positive voltage control signal and a power supply device which has the negative power supply control circuit.

2. Description of Related Art

An imaging device such as a CCD (Charge Coupled Device) or CMOS (Complementary Metal Oxide Semiconductor) image sensor requires both of positive and negative voltages as a drive voltage. Thus, an electronic device which has the imaging device is provided with a positive voltage regulator circuit which outputs a positive voltage and a negative voltage regulator circuit which outputs a negative power supply voltage. For the positive voltage regulator circuit and the negative voltage regulator circuit, reset control of the circuit or on/off control of output is performed by a microcomputer or the like in some cases. In order to perform such processing to the negative voltage regulator circuit, it is necessary to convert a positive voltage control signal which is output from the microcomputer into a negative voltage control signal and output the converted signal to the negative voltage regulator circuit.

Japanese Patent Application Laid Open Publication No. 2012-063849 shows a negative power supply control circuit 100 (see FIG. 1) that converts a positive voltage control signal, which is input to a control signal input terminal Vcont0, into a negative voltage control signal Va0. In the negative power supply control circuit 100 shown in FIG. 1, when a control signal at a low level is input to the control signal input terminal Vcont0, a current I1 which flows in a voltage current conversion circuit 110 is zero. By a current source 120 drawing a current I2 from a connection point a, a control signal Va0 at a low level (negative voltage) is output to the connection point a. When a control signal (positive voltage) at a high level is input to the control signal input terminal Vcont0, the current I1 flows in the voltage current conversion circuit 110. The current I1 becomes larger than the current I2 of the current source 120, and raises the voltage at the connection point a. Furthermore, the clamp circuit 130 draws part of the current I1 to clamp the voltage of the connection point a to the ground potential. Thus, it is possible to output a control signal Va0 at a high level (which is nearly the ground potential) to the connection point a.

Figure 1:
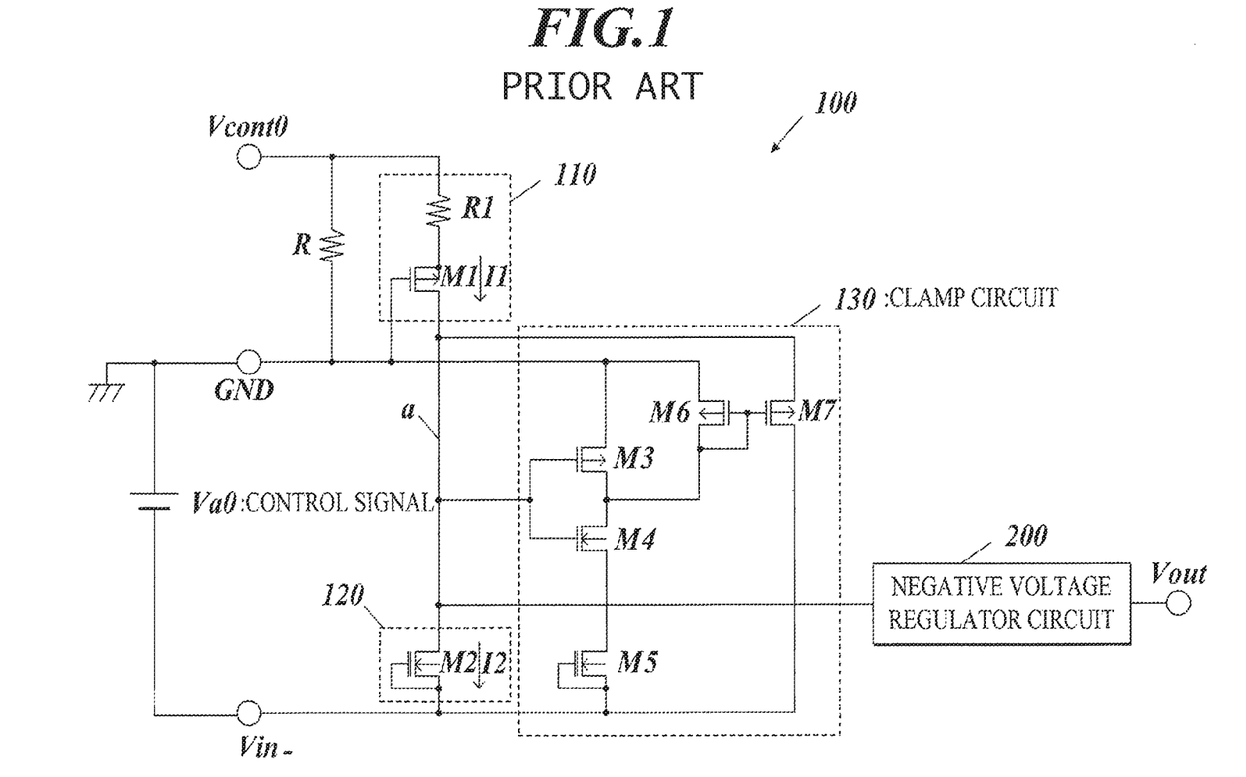
FIG. 1 is a view showing a conventional negative power supply control circuit.

As described above, according to the negative power supply control circuit 100 in FIG. 1, it is possible to convert the positive voltage control signal, which is input to the control signal input terminal Vcont0, into the negative voltage control signal Va0. However, in the negative power supply control circuit 100 in FIG. 1, when the voltage value of the control signal input terminal Vcont0 becomes higher than a defined value, there arises a problem of large increase in the current I1 flowing in the voltage current conversion circuit 110. That is, the current drawn into the circuit from the control signal input terminal Vcont0 becomes greatly large. Normally, the control signal is output from the microcomputer to the control signal input terminal Vcont0. However, in general, the microcomputer does not have any output terminal capable of applying the large current. Thus, the increase in the current of the control signal input terminal Vcont0 causes a problem that the control signal which is input to the control signal input terminal Vcont0 cannot be maintained in a normal voltage range.

Furthermore, in the negative power supply control circuit 100 in FIG. 1, when the voltage value of the control signal input terminal Vcont0 is higher than the defined value, the current drawing by the clamp circuit 130 cannot catch up with the increase in the current I1 of the voltage current conversion circuit 110. When the current drawing cannot catch up with the increase in the current I1, there arises a problem that the voltage of the control signal Va0 becomes a voltage (positive voltage) higher than the ground potential.

In the negative power supply control circuit, if it is possible to handle a plurality of types of control signals having different voltage values as the input positive voltage control signal, it is possible to incorporate a same circuit into a plurality of types of devices having different specifications and obtain effects such as reduction of manufacturing cost of the circuit. However, in the negative power supply control circuit 100 in FIG. 1, there is a problem that it is difficult to successfully handle a case where the control signal of a high voltage is input to the control signal input terminal Vcont0 as described above.

An object of the present invention is to provide a negative power supply control circuit which can suppress the increase in current flowing into the circuit from the control signal input terminal and suppress the excess of the converted negative voltage control signal over the ground potential even when a control signal of a high voltage is input to the control signal input terminal. In addition, an object of the present invention is to provide a power supply device which has such a negative power supply control circuit.

SUMMARY OF THE INVENTION

In order to achieve at least one of the above objects, according to one aspect of the present invention, there is provided a negative power supply control circuit which controls a negative voltage regulator circuit based on a positive voltage control signal, the negative power supply control circuit including: a control signal input terminal to which the positive voltage control signal is input; a negative voltage input terminal to which a negative power supply voltage is input; a negative voltage control signal output terminal to which a negative voltage control signal is output; a voltage current conversion circuit which is connected between the control signal input terminal and the negative voltage input terminal, and causes a current to flow based on the positive voltage control signal; a first current source which is connected in series with the voltage current conversion circuit, and is able to draw a current into the negative voltage input terminal; and a first clamp circuit which is connected in series with the voltage current conversion circuit and the first current source between the voltage current conversion circuit and the first current source, wherein the first clamp circuit clamps a voltage at a first intermediate point between the first clamp circuit and the first current source by limiting a current flowing in the first clamp circuit according to the voltage at the first intermediate point in a period when a current flows in the voltage current conversion circuit, and the negative voltage control signal is generated based on a voltage or a current in a current path through the voltage current conversion circuit, the first clamp circuit and the first current source.

According to the configuration, the first clamp circuit is connected in series with the voltage current conversion circuit, and clamps the voltage at the first intermediate point by limiting the current according to the voltage at the first intermediate point. Accordingly, the current flowing from the control signal input terminal does not increase even if a control signal of a high voltage is input to the control signal input terminal. Since the conventional clamp circuit 130 shown in FIG. 1 clamps the voltage by increasing the drawing amount of the current, there has been a problem that the current drawing cannot catch up with the increase in current and the voltage of the negative voltage control signal becomes higher than the ground potential when the current flowing from the control signal input terminal increases. However, in the present invention, since the first clamp circuit clamps the voltage by limiting the current amount, phenomenon as causing the shortage of voltage clamping does not occur compared to the clamp circuit in FIG. 1. Accordingly, by the configuration according to the present invention, it is possible to suppress the excess of the converted control signal over the ground potential even if the control signal of the high voltage is input to the control signal input terminal.

Preferably, the first clamp circuit may be an NMOS transistor which has a gate connected to a ground potential, a drain connected to the voltage current conversion circuit, and a source and a back gate connected to the first intermediate point.

By such a configuration, it is possible to achieve reduction of the number of elements in the negative power supply control circuit and reduction of the circuit area.

More preferably, the negative power supply control circuit according to the present invention may further include a second clamp circuit which clamps the voltage at the first intermediate point to a voltage higher than the negative power supply voltage in a period when a current does not flow in the first current source.

By such a configuration, it is possible to suppress application of an excess voltage to the voltage current conversion circuit when the positive voltage control signal changes from a low level to a high level. Thus, it is possible to reduce the required voltage resistance of the voltage current conversion circuit.

More preferably, the negative power supply control circuit according to the present invention may further include a second current source which causes a current to flow from a ground potential to the negative voltage input terminal; a first current mirror which is able to transfer a current of the second current source and cause a current to flow to a second intermediate point between the ground potential and the negative voltage input terminal; and a second current mirror which is able to transfer a current flowing in the voltage current conversion circuit, the first clamp circuit and the first current source, and draw a current from the second intermediate point, and the negative voltage control signal Output terminal may be the second intermediate point.

By such a configuration, it is possible to prevent the converted negative voltage control signal from becoming unstable even if the absolute value of the negative power supply voltage input to the negative voltage input terminal is small.

Furthermore, the negative power supply control circuit according to the present invention may be configured such that a discharge switch of an output capacitor included in the negative voltage regulator circuit is controlled.

In the electronic device having the imaging device, the output capacitor included in the negative voltage regulator circuit is discharged at a high speed many times in some cases. Accordingly, by applying the negative power supply control circuit of the present invention, which can suppress the current flowing into the control signal input terminal, for control of the discharge of the negative voltage regulator circuit, there are obtained effects that it is possible to stably achieve the high-speed discharge control and largely reduce the consumed current of the electronic device.

Furthermore, according to another aspect of the present invention, there is provided a power supply device including: the above-mentioned negative power supply control circuit; and a negative voltage regulator circuit which is controlled by the negative voltage control signal of the negative power supply control circuit.

Thus, there are obtained effects that it is possible to suppress the increase in current flowing into the circuit from the control signal input terminal and suppress the excess of the converted negative voltage control signal over the ground potential even if the control signal of a high voltage is input to the control signal input terminal.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENT

Hereinafter, each embodiment of the present invention will be described in detail with reference to the drawings.

(Embodiment 1)

Figure 2:
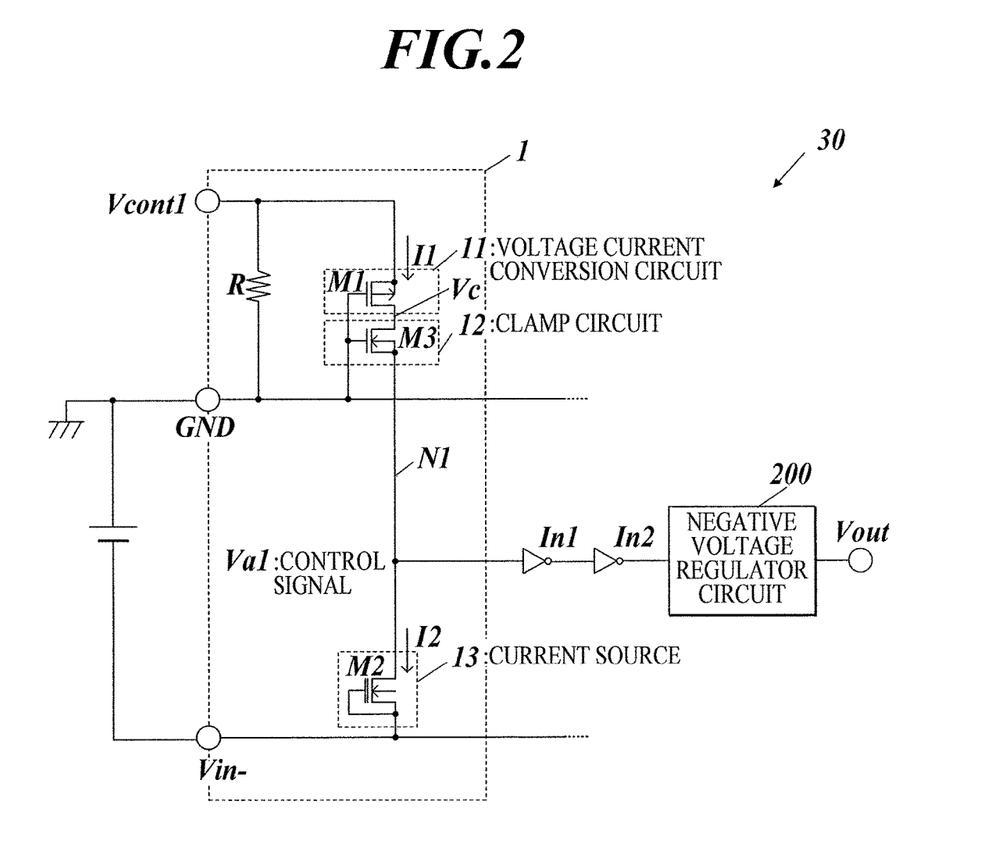
FIG. 2 is a view showing a negative power supply control circuit according to an embodiment 1 of the present invention.

FIG. 2 is a view showing a negative power supply control circuit according to an embodiment 1 of the present invention.

The negative power supply control circuit 1 in the embodiment 1 is a circuit in which a positive voltage control signal is input to a control signal input terminal Vcont1 and a negative voltage control signal Va1 is output to a first intermediate point N1. The first intermediate point N1 corresponds to an example of a negative voltage control signal output terminal according to the present invention. The positive voltage control signal is input by a microcomputer, for example. The negative voltage control signal Va1 is output to a negative voltage regulator circuit 200 via inverters In1 and In2 which operate by a negative power supply voltage, and the negative voltage control signal Va1 is used for predetermined control such as output switching of the negative voltage regulator circuit 200 or discharge control of the output capacitor. The negative voltage regulator circuit 200 generates a negative power supply voltage and outputs the generated voltage to an output terminal Vout, Inverters In1 and In2 and the negative voltage regulator circuit 200 have transistors which operate by the negative power supply voltage, and requires the negative voltage control signal when the transistors are controlled from outside. A power supply device 30 according to the embodiment 1 of the present invention includes the negative power supply control circuit 1, the inverters In1 and In2 and the negative voltage regulator circuit 200.

As shown in FIG. 2, the negative power supply control circuit 1 includes a control signal input terminal Vcont1 to which a positive voltage control signal is input, a negative voltage input terminal Vin− to which a negative power supply voltage is input, a ground terminal GND which is grounded, a voltage current conversion circuit 11, a first clamp circuit 12 and a first current source 13. The voltage current conversion circuit 11, the first clamp circuit 12 and the first current source 13 are connected in series in this order between the control signal input terminal Vcont1 and the negative voltage input terminal Vin−. The first intermediate point N1 to which the negative voltage control signal Va1 is output is a connection point between the first clamp circuit 12 and the first current source 13. Hereinafter, the positive voltage control signal which is input to the control signal input terminal Vcont1, the negative power supply voltage which is input to the negative voltage input terminal Vin− and the ground potential are respectively represented by the same codes of "Vcont1", "Vin−" and "GND". Similarly, positive voltage control signals which are input to control signal input terminals Vcont2 and Vcont3 in aftermentioned embodiments 2 and 3 are respectively represented by "Vcont2" and "Vcont3".

The voltage current conversion circuit 11 interrupts the current I1 when the positive voltage control signal Vcont1 is at a low level, and the voltage current conversion circuit 11 causes the current I1 to flow when the positive voltage control signal Vcont1 is at a high level. The voltage current conversion circuit 11 can be formed of a PMOS transistor (p-channel MOSFET: metal-oxide-semiconductor field-effect transistor) M1 which has a gate that is grounded and a source and a back gate connected to the control signal input terminal, for example.

The first current source 13 is a circuit capable of causing a fixed amount of saturation current I2 to flow. The first current source 13 causes the current I2 to flow when a predetermined voltage or more is applied between both ends. The first current source 13 can be formed of a depletion type NMOS transistor (n-channel MOSFET) M2 which has a gate and a source connected to the negative voltage input terminal Vin− and a drain connected to the first intermediate point N1, for example.

The first clamp circuit 12 clamps the voltage at the first intermediate point N1 when the current flows in the voltage current conversion circuit 11, The first clamp circuit 12 clamps the voltage of the first intermedium point N1 by limiting the current flowing in the first clamp circuit 12 according to the voltage at the first intermediate point N1. The first clamp circuit 12 can be formed of a NMOS transistor M3 which has a gate that is grounded, a source and a back gate connected to the first intermediate point N1 and a drain connected to an end of the voltage current conversion circuit 11, for example.

In the negative power supply control circuit 1, a pull-down resistor R may be further connected between the control signal input terminal Vcont1 and the ground terminal GND. The resistor R pulls down the voltage of the control signal input terminal Vcont1 to a low level in a period when a signal at a high level is not input to the control signal input terminal Vcont1.

<Operation>

When the control signal Vcont1 is at a low level (ground potential GND), the gate-source voltage of the PMOS transistor M1 is 0V, the PMOS transistor M1 is turned off and the current I1 is 0. On the other hand, since the first current source 13 can draw the current I2 into the negative voltage input terminal Vin−, the voltage at the first intermediate point N1 becomes a negative power supply voltage Vin− (low level of negative voltage).

When the control signal Vcont1 is at a high level, the gate-source voltage of the PMOS transistor M1 exceeds a threshold voltage, the PMOS transistor M1 is turned on to cause the current I1 to flow. By the current I1 exceeding the saturation current I2 of the first current source 13, the voltage at the first intermediate point N1 rises. When the voltage at the first intermediate point N1 becomes higher than the ground potential GND, the gate-source voltage of the NMOS transistor M3 is lowered, the NMOS transistor M3 is turned off and the current I1 becomes zero. When the current I1 does not flow, the first current source 13 draws the current I2, and lowers the voltage at the first intermediate point N1. Accordingly, the on-resistance and the amount of current of the NMOS transistor M3 are adjusted into an equilibrium state of them, and the voltage at the first intermediate point N1 is clamped to a voltage which is a little lower than the ground potential GND.

By such an operation, there is output, to the first intermediate point N1, a negative voltage control signal Va1 which switches between a low level and a high level in the range between the ground potential GND and the negative power supply voltage Vin−.

As described above, according to the negative power supply control circuit 1 in the embodiment 1, the NMOS transistor M3 which is the first clamp circuit 12 is connected in series with the PMOS transistor M1 which is the voltage current conversion circuit 11. Furthermore, in a period when the current I1 flows in the PMOS transistor M1, the first clamp circuit 12 limits the current flowing therein according to the voltage at the first intermediate point N1, and clamps the voltage at the first intermediate point N1. In the conventional negative power supply control circuit 100 shown in FIG. 1, the clamp circuit 130 has clamped the voltage by drawing part of the current I1. Thus, there has been easily caused situations in which the voltage cannot be clamped, such as shortage of current drawing into the clamp circuit 130, when the voltage value of control signal Vcont1 becomes high and the current I1 becomes large. In contrast, in the first clamp circuit 12 in the embodiment 1, situations in which the voltage clamping cannot be performed do not occur since the first clamp circuit 12 clamps the voltage by limiting the current flowing therein. Accordingly, according to the negative power supply control circuit 1 in the embodiment 1, even if the voltage value of control signal Vcont1 becomes high, it is possible to surely suppress the converted control signal Va1 to a negative voltage.

If a positive voltage is input to the inverter In1 which operates with a negative power supply voltage, there possibly arises a latch-up of the configuration element of the inverter In1. If a positive voltage is input to a control element which operates with a negative power supply voltage in the negative voltage regulator circuit 200, there possibly arises a latch-up of the control element. However, according to the negative power supply control circuit 1 in the embodiment, the negative voltage control signal Va1 surely has a negative voltage even if the control signal Vcont1 becomes a high voltage. Thus, inconveniencies such as a latch-up of the control target do not occur. Accordingly, the negative power supply control circuit 1 in the embodiment 1 can be applied even to the system in which a high voltage is applied to the control signal input terminal Vcont1.

According to the negative power supply control circuit 1 in the embodiment 1, the current I1 flowing to the first clamp circuit 12 via the voltage current conversion circuit 11 is limited, and the voltage at the first intermediate point N1 is clamped. Accordingly, even if the voltage value of the control signal Vcont1 becomes high, the current flowing into the control signal input terminal Vcont1 does not increase.

According to the negative power supply control circuit 1 in the embodiment 1, since the above-mentioned function is achieved by three MOS transistors mainly, it is possible to achieve reduction in the number of elements and the circuit area. According to the power supply device 30 in the embodiment 1, the effects of the negative power supply control circuit 1 which were mentioned above can be obtained.

(Embodiment 2)

In the above-mentioned negative power supply control circuit 1 in the embodiment 1 (see FIG. 2), when the control signal Vcont2 is at a low level, the NMOS transistor M3 is turned on, and the voltage Vc between the PMOS transistor M1 and the NMOS transistor M3 becomes a negative power supply voltage Vin–. Thus, there is a problem that a large voltage "Vcont2–Vin–" is applied between the source and the drain of the PMOS transistor M1 the moment the control signal Vcont2 switches from a low level to a high level. Accordingly, in the negative power supply control circuit 1 in the embodiment 1, there arises a restriction that the voltage value of the negative power supply voltage Vin– needs to be limited or the voltage resistance of the PMOS transistor M1 needs to be raised. Such a problem can be solved in a negative power supply control circuit 1A in an embodiment 2.

Figure 3:
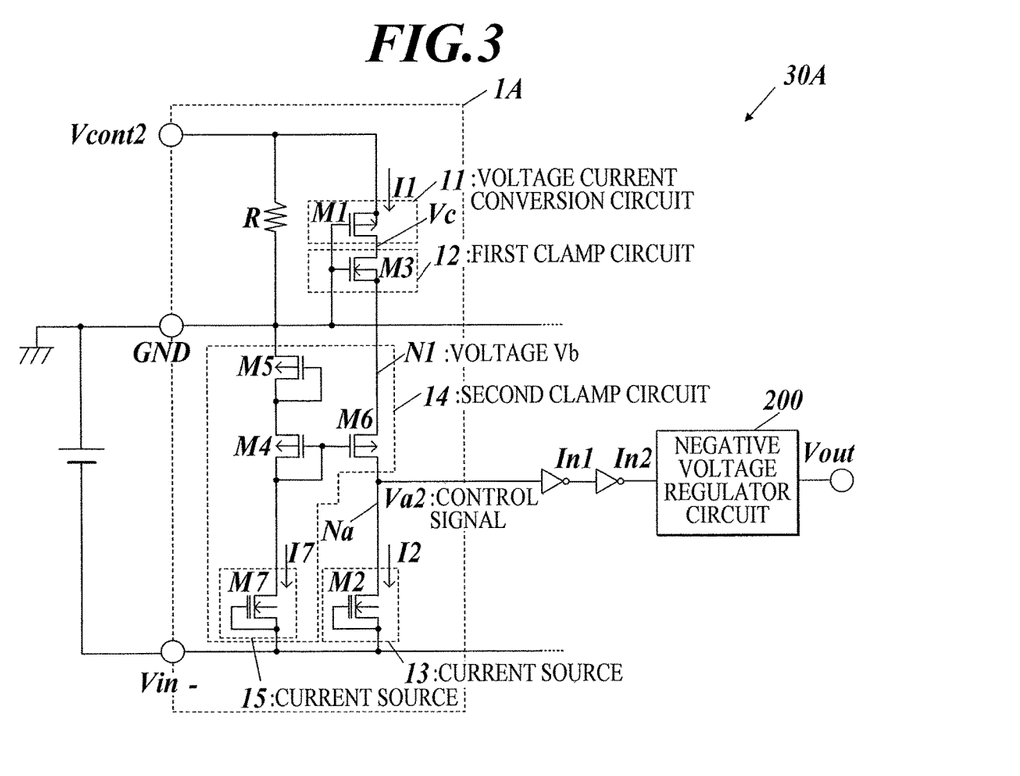
FIG. 3 is a view showing a negative power supply control circuit according to an embodiment 2 of the present invention.

FIG. 3 is a view showing a negative power supply control circuit according to the embodiment 2 of the present invention.

The negative power supply control circuit 1A in the embodiment 2 is different from the embodiment 1 mainly in that the negative power supply control circuit 1A in the embodiment 2 includes a second clamp circuit 14. As for the components similar to those of the embodiment 1, the detailed explanation is omitted by providing same reference numerals or codes. The power supply device 30A in the embodiment 2 includes the negative power supply control circuit 1A, inverters In1 and In2 and the negative voltage regulator circuit 200.

In the embodiment 2, the voltage current conversion circuit 11, the first clamp circuit 12, a PMOS transistor M6 of the second clamp circuit 14 and the first current source 13 are connected in series in this order between the control signal input terminal Vcont2 and the negative voltage input terminal Vin–. The negative power supply control circuit 1A outputs a negative voltage control signal Va2 to a connection point Na between the PMOS transistor M6 of the second clamp circuit 14 and the first current source 13. The connection point Na corresponds to an example of a negative voltage control signal output terminal according to the present invention.

The second clamp circuit 14 clamps the voltage at the first intermediate point N1 to a voltage higher than the negative power supply voltage Vin– in a period when the current I1 does not flow in the PMOS transistor M1. The second clamp circuit 14 includes a plurality of PMOS transistors M4 and M5 and a second current source 15 which are connected in series between the ground terminal GND and the negative voltage input terminal Vin–. Furthermore, the second clamp circuit 14 further includes the PMOS transistor M6 which is connected between the first clamp circuit 12 and the first current source 13.

The second current source 15 is formed of a depletion type NMOS transistor M7, for example, which has a gate and a source connected to the negative voltage input terminal Vin–, and has a drain connected to the ground terminal GND via a plurality of PMOS transistors M4 and M5. The plurality of PMOS transistors M4 and M5 are in diode connection by short-circuiting the gate and the drain. By such a configuration, a fixed amount of current I7 flows in the second current source 15, and the PMOS transistors M4 and M5 are turned on.

The PMOS transistor M6 which is connected to one current path shares a common gate with the PMOS transistor M4 which is connected to the second current source 15 in the other current path.

Hereinafter, the gate-source voltage of the PMOS transistors M1, M4, M5 and M6 and the NMOS transistor M3 are respectively described as "Vgs1", "Vgs4", "Vgs5", "Vgs6" and "Vgs3". The drain-source voltage of the PMOS transistor M1 is described as "Vds1", and the voltage at the first intermediate point N1 is described as "Vb".

<Operation>

When the positive voltage control signal Vcont2 is at a low level, the PMOS transistor M1 is turned off and does not cause the current I1 to flow. Thus, the current of the PMOS transistor M6 is zero. When the current of the PMOS transistor M6 is zero, the gate-source voltage Vgs6 of the PMOS transistor M6 is 0V. Accordingly, the voltage Vb at the first intermediate point N1 is obtained by the following formula (1). Furthermore, since the gate-source voltage Vgs3 of the NMOS transistor M3 is the voltage –Vb, the NMOS transistor M3 is turned on, and satisfies the following formula (2).

$$Vb = -Vgs5 - Vgs4 \qquad (1)$$

$$Vc = Vb \qquad (2)$$

Accordingly, at the moment the positive voltage control signal Vcont2 switches from a low level to a high level, the voltage Vds1 applied to the PMOS transistor M1 becomes the voltage indicated by the following formula (3). As described later, the voltages Vb and Vc are values which are not influenced by the negative power supply voltage Vin–, and the formula (3) shows that the negative power supply voltage Vin– does not influence the voltage applied to the PMOS transistor M1.

$$Vds1 = Vcont2 - Vc = Vcont2 - Vb = Vcont2 + Vgs5 + Vgs4 \qquad (3)$$

When the positive voltage control signal Vcont2 is at a high level, the saturation current I1 which can flow in the PMOS transistor M1 follows the following formula (4).

$$I1=(½)\mu s\cdot(W1/L1)\cdot(Vgs1-Vth)^2 \quad (4)$$

Here, μs indicates a channel movement degree, W1 indicates a gate width, L1 indicates a gate length and Vth indicates a threshold voltage.

The NMOS transistor M3 and the PMOS transistor M6 operate as in the gate grounded circuit. When the current I1 reaches the current I2, the voltage of the connection point Na rises and the negative voltage control signal Va2 becomes a high level. Here, the voltage Vb at the first intermediate point N1 is shown by the following formula (5). If the voltage Vb becomes higher than the ground potential GND and the voltage Vgs3 is lowered, the NMOS transistor M3 is turned off, and does not cause the current I1 to flow. Thus, the voltage Vgs3 is a value satisfying the following formula (6). If the voltage Vb is lowered and the voltage Vgs6 is lowered, the PMOS transistor M6 is turned off, and does not cause the current I1 to flow. Thus, the voltage Vgs6 is a value satisfying the formula (7).

$$Vb=-Vgs3=-Vgs5-Vgs4+Vgs6 \quad (5)$$

$$Vgs3 \geq Vth3 \quad (6)$$

$$Vgs6 \geq Vth6 \quad (7)$$

Here, the Vth3 and the Vth6 are threshold voltages.

When 0.4 V is assigned to each of the threshold voltages Vth3 and Vth6, and 1V is assigned to each of the voltages Vgs4 and Vgs5, it is found that the voltage Vb at the first intermediate point N1 is clamped in the range of the following formula (8).

$$Vb=-0.4V \sim -1.6V \quad (8)$$

Figure 4:
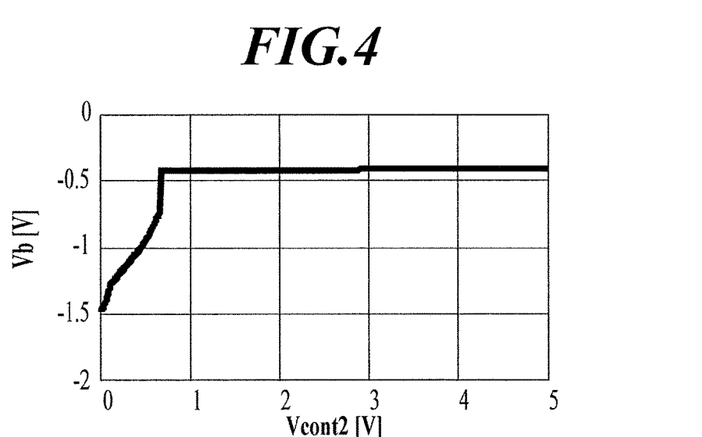
FIG. 4 is a graph showing a relationship between the voltage of the control signal input terminal and the clamp voltage.

FIG. 4 shows a graph indicating a relationship between the voltage Vb and the voltage of the control signal Vcont2. By the above operation, the voltage Vb at the first intermediate point N1 is clamped as in the graph of FIG. 4. Here, the negative power supply voltage Vin− is set to be approximately −6V. Next, the action and effect by the negative power supply control circuit 1A in the embodiment 2 will be described.

<Relationship Between Negative Power Supply Voltage Vin− and Element Voltage Resistance>

As shown in the graph of FIG. 4, when the control signal Vcont2 is at a low level (0V), the voltage Vb at the first intermediate point N1 is clamped to a voltage higher than the negative power supply voltage Vin−. Accordingly, at the moment the positive voltage control signal Vcont2 switches from a low level to a high level, the excess of the voltage Vds1 applied to the PMOS transistor M1 is avoided, and it is possible to reduce the voltage resistance of the PMOS transistor M1.

<Polarity of Negative Voltage Control Signal Va2>

As shown in the graph of FIG. 4, the voltage Vb at the first intermediate point N1 is suppressed to be lower than the ground potential GND even if the voltage value of the control signal Vcont2 becomes large. Thus, the voltage (control signal Va2) of the connection point Na becomes a voltage lower than the ground potential GND. Accordingly, even when the control signal Vcont2 becomes a high voltage, it is possible to surely suppress the negative voltage control signal Va2 to be a voltage lower than the ground potential GND.

<Relationship Between Control Signal Vcont2 of Positive Voltage and Element Voltage Resistance>

When the control signal Vcont2 is at a high level, the voltage Vgs1 becomes large, and the on-resistance of the PMOS transistor M1 becomes small, leading to the following formula (8).

$$Vc \approx Vcont2 \quad (8)$$

Furthermore, the voltage Vc−Vb=Vcont2−Vb is applied to the NMOS transistor M3 which performs voltage clamping. Accordingly, the voltage value of the control signal Vcont2 is limited not to exceed the element voltage resistance of the NMOS transistor M3. For example, in a case where the voltage resistance of the NMOS transistor M3 is 6V, the voltage value of the control signal Vcont2 is limited to be equal to or lower than 5.6V. However, even in this case, if the control signal Vcont2 is output from a general microcomputer or the like, the voltage is approximately 1.8V or 3.3V, and does not exceed the voltage resistance.

<Current of Control Signal Input Terminal Vcont2>

The current Icont flowing from the control signal input terminal Vcont2 is the sum of the pull-down current flowing in the resistor R and the current I1 of the PMOS transistor M1. Furthermore, the current I1 is limited to the current I2 of the first current source 13, thus leading to the following formula (9).

$$Icont=(Vcont2/R)+I1=(Vcont2/R)+I2 \quad (9)$$

Here, the resistance value of the resistor R is represented by the same code of the resistor R. The resistance value R is set to be a sufficiently large value. Accordingly, even if the voltage value of the positive voltage control signal Vcont2 becomes high, it is possible to suppress the large increase in the current Icont flowing from the control signal input terminal Vcont2.

As described above, according to the negative power supply control circuit 1A and the power supply device 30A in the embodiment 2, there is obtained an effect of reducing the required voltage resistance of the PMOS transistor M1 in addition to the same effects as those of the embodiment 1.

(Embodiment 3)

In the negative power supply control circuit 1A in the embodiment 2 shown in FIG. 3, when the negative power supply voltage Vin− is a value (for example, −0V~−1.5V) higher than the operation voltage of the transistor, the circuit does not operate normally in some cases. Specifically, in such a case, when the control signal Vcont3 becomes a high level, the PMOS transistor M6 does not function as the gate grounded circuit due to the reduction of the voltage Vgs6, the on-resistance of the PMOS transistor M6 rises, and the current I1 is lowered. By the reduction of the current I1, even if the positive voltage control signal Vcont3 is at a high level, there is caused an abnormality that the negative voltage control signal Va2 output to the connection point Na is inverted to the low level (negative power supply voltage Vin−). A negative power supply control circuit 1B in an embodiment 3 can solve such a problem.

Figure 5:
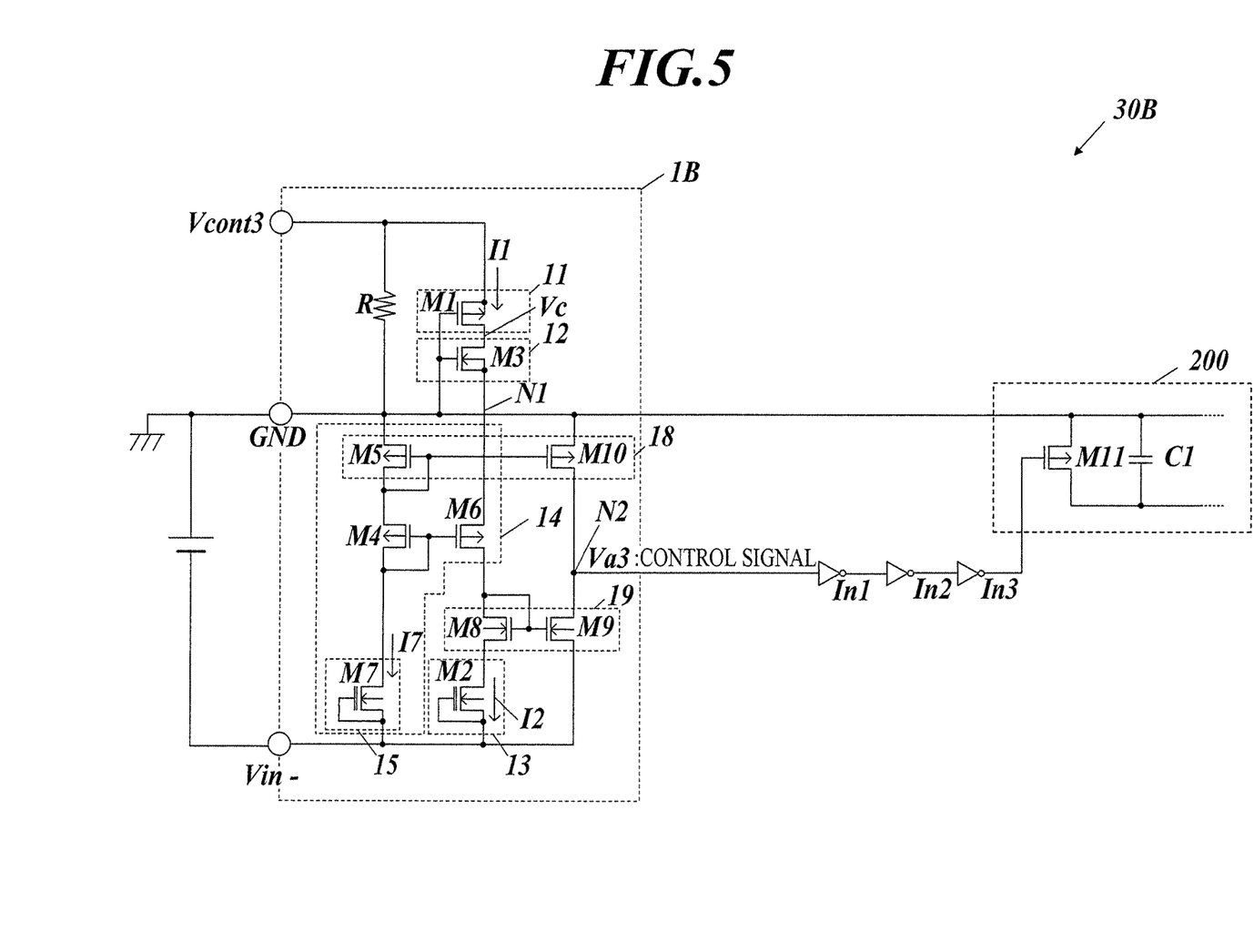
FIG. 5 is a view showing a negative power supply control circuit according to an embodiment 3 of the present invention.

FIG. 5 is a view showing the negative power supply control circuit 1B according to the embodiment 3.

The negative power supply control circuit 1B according to the embodiment 3 is different from that of the embodiment 2 mainly in that a first current mirror 18 and a second current mirror 19 are provided in order to output a negative voltage control signal Va3. A power supply device 30B according to the embodiment 3 includes the negative power supply control circuit 1B, the inverters In1, In2 and In3 and the negative voltage regulator circuit 200. The detailed explanation of the same configuration elements as those of the embodiment 2 is omitted by providing the same reference numerals or codes.

In the embodiment 3, a PMOS transistor M10 of the first current mirror 18 which transfers the current I7 and an NMOS transistor M9 of the second current mirror 19 which transfers the current I1 (=I2) are connected in series between the ground potential GND and the negative voltage input terminal Vin−. In the negative power supply control circuit 1B, the negative voltage control signal Va3 is output to a second intermediate point N2 therebetween. The second intermediate point N2 corresponds to an example of the negative voltage control signal output terminal according to the present invention. The negative voltage control signal Va3 in the embodiment 3 has the polarity opposite to those of the embodiments 1 and 2. The control signal Va3 is used for controlling a discharge switch M11 of an output capacitor C1 in the negative voltage regulator circuit 200 via the inverters In1 to In3. A negative power supply voltage is applied to the output capacitor C1, and the inverters In1 to In3 and the discharge switch M11 operate by the negative power supply voltage.

The first current mirror 18 has PMOS transistors M5 and M10 which have sources connected to the ground terminal GND and share a common gate. The gate and drain of one PMOS transistor M5 are short-circuited. This configuration causes the transfer current of the current I7 flowing in the one PMOS transistor M5 to flow in the other PMOS transistor M10. The PMOS transistor M10 causes the transfer current to flow when its source-drain voltage is large. Though the transfer rate of the first current mirror 18 is not limited, the transfer rate here is 1:1.

The second current mirror 19 has NMOS transistors M8 and M9 sharing a common gate. One NMOS transistor M8 has a gate and a drain which are short-circuited and a source which is connected to the first current source 13. The NMOS transistor M8 is connected in series with the first current source 13 and the PMOS transistor M6 between the first current source 13 and the PMOS transistor M6, and causes the current I1 flowing in the voltage current conversion circuit 11 to flow. The other NMOS transistor M9 has a source connected to the negative voltage input terminal Vin−. When a current less than the saturation current I2 flows in the first current source 13 (I1<I2), the source-drain voltage of the NMOS transistor M2 of the first current source 13 is nearly 0V, and is equivalent to the source voltage of the NMOS transistors M8 and M9. Accordingly, at this time, it is possible to cause the transfer current of the current I1 flowing in the one NMOS transistor M8 to flow in the other NMOS transistor M9. The NMOS transistor M9 causes the transfer current to flow when its source-drain voltage is large. Though the transfer rate of the second current mirror 19 is not limited, the transfer rate here is 1:1.

<Operation>

The voltage current conversion circuit 11, the first clamp circuit 12, the first current source 13 and the second clamp circuit 14 in the embodiment 3 operate similarly to the embodiment 2.

When the control signal Vcont3 is at a low level, the current I1 is zero, and the current I1 is transferred to the NMOS transistor M9 by the second current mirror 19. Since the current I7 is transferred to the PMOS transistor M10 by the first current mirror 18, a current flows to the second intermediate point N2 from the ground terminal GND, and a control signal Va3 at a high level (voltage slightly lower than the ground potential GND) is output to the second intermediate point N2.

When the control signal Vcont3 is at a high level, the current I1 becomes large, and the saturation current I2 of the first current source 13 flows to the NMOS transistor M8 of the second current mirror 19. At this time, in the second current mirror 19, since the source voltage of the NMOS transistor M9 of the transfer destination is lower than the source voltage of the NMOS transistor M8 of the transfer source, the NMOS transistor M9 can cause the current which is the current I2 or more to flow. The current I7 is transferred to the PMOS transistor M10 in the first current mirror 18. Here, the current I7 is set to be a sufficiently small value, and the current drawing by the NMOS transistor M9 is larger than the current flowing to the second intermediate point N2, and the control signal Va3 at a low level is output to the second intermediate point N2.

Next, the description will be made for a case where the negative power supply voltage Vin− is higher than the operation voltage of the transistor (for example, −0V~−1.5V). In such a situation, when the control signal Vcont3 becomes a high level, the gate-source voltage Vgs6 of the PMOS transistor M6 becomes small, and the current I1 also becomes small. However, the current I7 of the second current source 15 can be set to be smaller than the current I1 at this time. By such a setting, it is possible to make the current drawing by the NMOS transistor M9 larger than the current flowing to the second intermediate point N2, and output the control signal Va3 at a low level to the second intermediate point N2.

Figure 6:
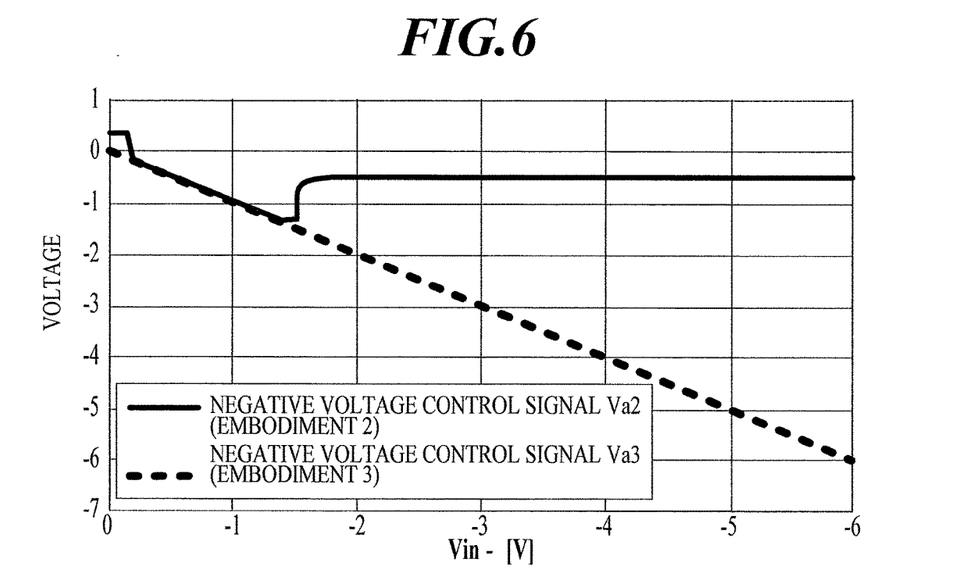
FIG. 6 is a graph showing a relationship between the amount of a negative power supply voltage and a negative voltage control signal.

As described above, according to the negative power supply control circuit 1B and the power supply device 30B in the embodiment 3, there is obtained an effect of achieving a normal operation even if the negative power supply voltage Vin− becomes a high voltage in addition to the same effect as that of the embodiment 2. FIG. 6 is a graph showing the relationship between the amount of the negative power supply voltage and the negative voltage control signal. In FIG. 6, the graph of the embodiment 2 indicates the voltage of the control signal Va2 when the positive voltage control signal Vcont3 is at a high level and the negative voltage control signal Va2 is at a high level. As shown by the graph of the embodiment 2, there is an inversion, to a low level, of the control signal Va2 to be at a high level when the negative power supply voltage Vin− is equal to or less than −1.5V. In FIG. 6, the graph of the embodiment 3 indicates the voltage of the control signal Va3 when the positive voltage control signal Vcont3 is at a high level and the negative voltage control signal Va3 is at a low level. As shown in this graph, even if the negative power supply voltage Vin− is equal to or less than −1.5V, the control signal Va3 is not inverted to a high level.

The configuration which was newly added in the embodiment 3 can also be added to the embodiment 1. The circuit after the addition to the embodiment 1 is achieved by a configuration excluding the PMOS transistors M4 and M6 from the negative power supply control circuit 1B in FIG. 5.

(Comparison Between Conventional Circuit and Embodiments 1 to 3)

Next, the characteristics are compared between the negative power supply control circuits 1, 1A and 1B in the embodiments 1 to 3 and the conventional negative power supply control circuit 100 (FIG. 1).

Figure 7:
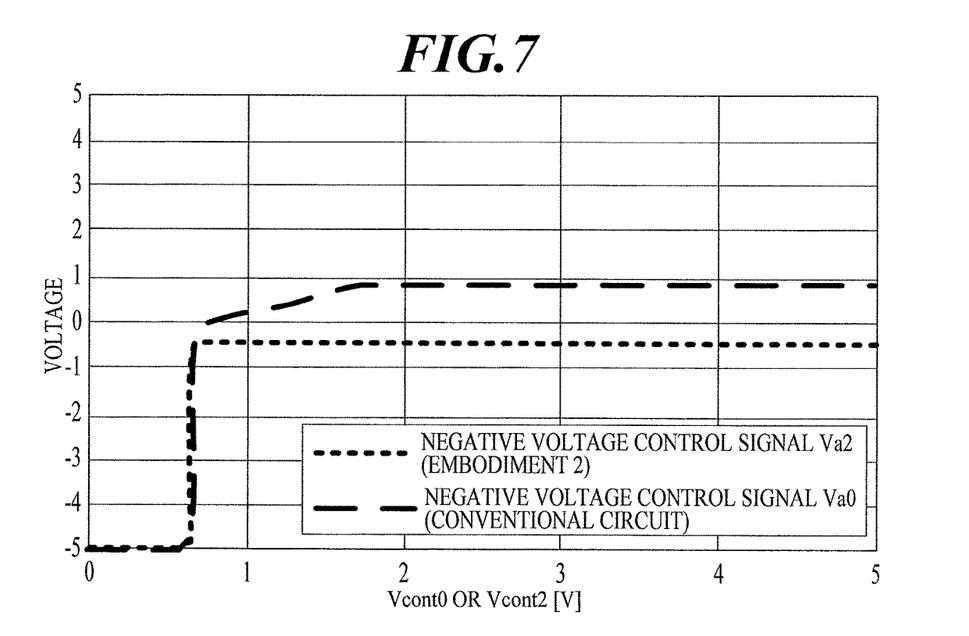
FIG. 7 is a graph showing a relationship between the voltage of the control signal input terminal and the negative voltage control signal.
Figure 8:
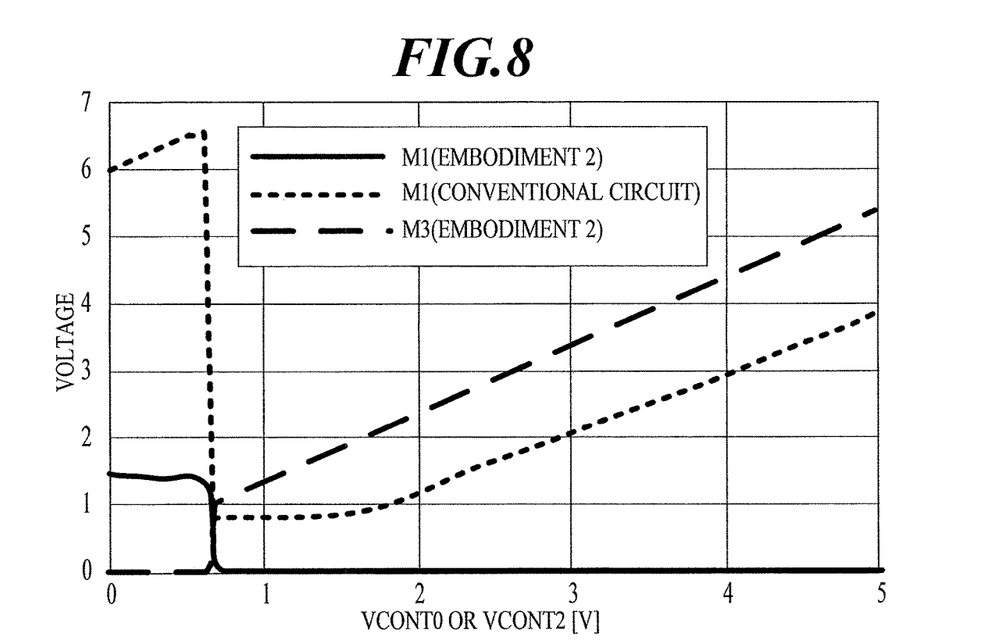
FIG. 8 is a graph showing a relationship between the voltage of the control signal input terminal and the voltage applied to each element.
Figure 9:
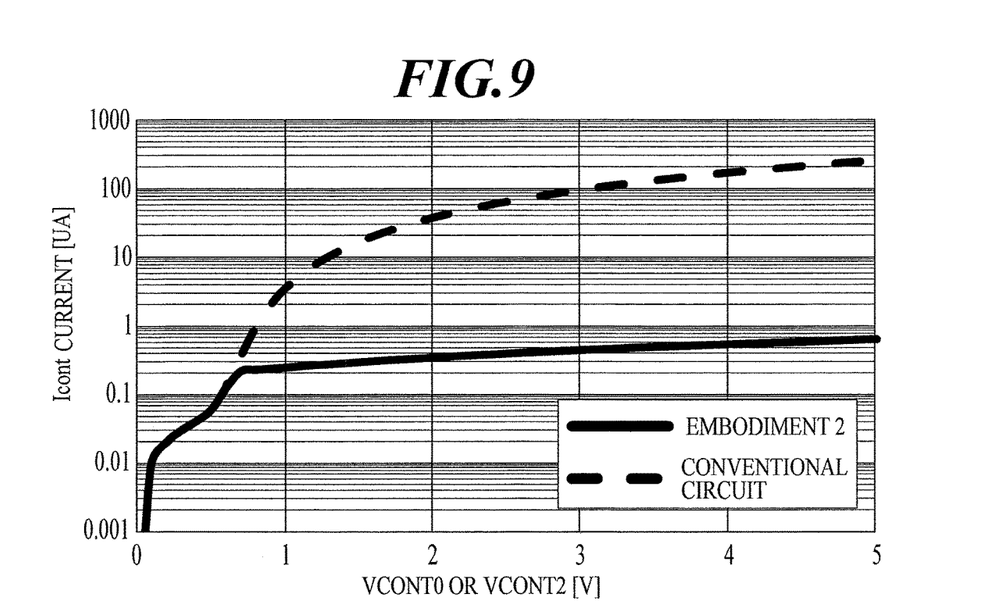
FIG. 9 is a graph showing a relationship between the voltage of the control signal input terminal and the current flowing into the control signal input terminal.

FIG. 7 is a graph showing a relationship between a voltage value of the control signal input terminal and a voltage of the negative voltage control signal. FIG. 8 is a graph showing a relationship between a voltage value of the control signal input terminal and a voltage applied to each element. FIG. 9 is a graph showing a relationship between a current value and a voltage value of the control signal input terminal. In FIG. 9, the current flowing from the control signal input terminal Vcont2 is represented as "Icont".

As shown in FIG. 7, in the conventional circuit (negative power supply control circuit 100 in FIG. 1), when the voltage value of the control signal Vcont0 rises, the current I1 increases to cause a shortage of the current drawing of the clamp circuit 130, and the negative voltage control signal Va0 rises to approximately +1V. However, in the negative power supply control circuit 1A in the embodiment 2, even if the voltage value of the positive voltage control signal Vcont2 rises, it is possible to suppress the negative voltage control signal Va2 to approximately −0.5V without exceeding the ground potential GND. This effect is also similarly obtained by the negative power supply control circuits 1 and 1B in the embodiments 1 and 3.

As shown in FIG. 8, in the conventional circuit (negative power supply control circuit 100 in FIG. 1), the drain voltage of the PMOS transistor M1 becomes a low voltage according to the negative power supply voltage Vin− when the control signal Vcont0 is at a low level. FIG. 8 shows a case where the negative power supply voltage Vin− is −6V. Thus, at the moment the control signal Vcont0 switches from a low level to a high level, the source-drain voltage of the PMOS transistor M1 becomes larger than the absolute value of the negative power supply voltage Vin−. For example, when the control signal Vcont0 is 0.7V, 6.5V is applied to the PMOS transistor M1. In a case where the voltage resistance of the PMOS transistor M1 is 6V, since the voltage resistance is destroyed, the negative power supply voltage Vin− needs to be set to be higher than −5.5V.

On the other hand, in the negative power supply control circuit 1A in the embodiment 2, as described above, when the control signal Vcont2 is at a low level, the second clamp circuit 14 clamps the voltage at the first intermediate point N1 to a voltage higher than the negative power supply voltage Vin−. Thus, it is possible to avoid application of a large voltage to the PMOS transistor M1 as in the conventional circuit. However, as mentioned above, since the voltage corresponding to the control signal Vcont2 is applied to the NMOS transistor M3, in a case where the voltage resistance of the NMOS transistor M3 is 6V, the control signal Vcont2 needs to be equal to or less than 5.6V. These effects and actions are also obtained similarly by the negative power supply control circuit 1B in the embodiment 3.

As shown in FIG. 9, in the conventional circuit (negative power supply control circuit 100 in FIG. 1), the current Icont becomes large in proportion to the control voltage Vcont0. This is based on that the current flowing in the voltage current conversion circuit 110 includes the current I1 of the above-mentioned formula (4) and that this current I1 is not limited. Though the current I1 of the formula (4) includes the squared term of the voltage Vgs1, the current I1 is represented by a linear formula of a voltage of the control signal Vcont0 by calculation of adding the action of voltage decrease by the current I1 and the resistor R1.

On the other hand, in the negative power supply control circuit 1A in the embodiment 2, the current I1 flowing in the PMOS transistor M1 does not reach the saturation current even if the control signal Vcont2 becomes high, and the current I1 is limited by the saturation current I2 of the first current source 13. In the depletion type NMOS transistor M2 forming the first current source 13, the current value can be set by the element size and the low current can be achieved by an occupied area of a substrate smaller than the resistor. Accordingly, in the negative power supply control circuit 1A in the embodiment 2, the consumption current of the negative power supply control circuit 1A is determined by the resistor R, and the low current which is 1/100 of the conventional circuit or the like can be easily achieved. The action and effect enabling this low current can be also obtained similarly in the negative power supply control circuits 1 and 1B in the embodiments 1 and 3.

Figure 10:
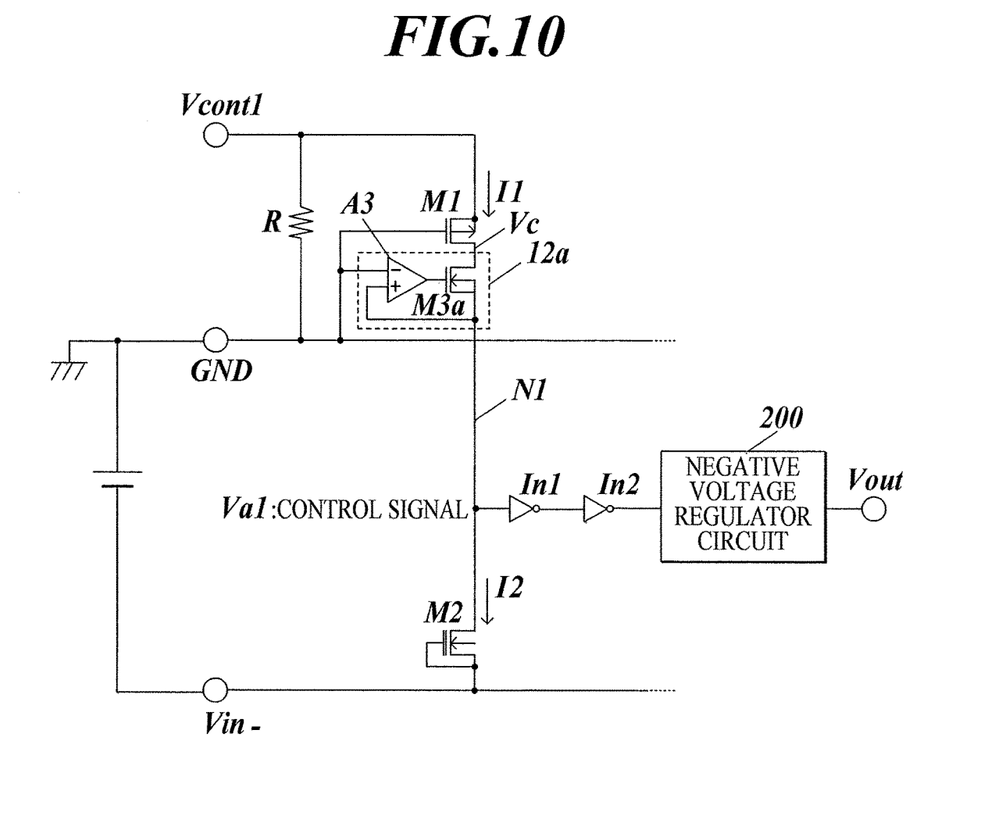
FIG. 10 is a circuit view showing a modification example of a first clamp circuit.

As described above, the embodiments of the present invention have been described. However, the present invention is not limited to the above embodiments. For example, though the NMOS transistor M3 is indicated as the first clamp circuit according to the present invention in the embodiments, the first clamp circuit may be any circuit which limits the current flowing in the first clamp circuit to clamp the voltage at the first intermediate point on the basis of the voltage at the first intermediate point. FIG. 10 is a circuit view showing a modification example of the first clamp circuit. For example, as shown in FIG. 10, there may be adopted a configuration which has a PMOS transistor M3a and a difference amplifier A3 as a first clamp circuit 12a. The PMOS transistor M3a is connected in series with the PMOS transistor M1 and the first current source 13 between the PMOS transistor M1 and the first current source 13, and has a gate which is connected to the output terminal of the difference amplifier A3. The difference amplifier A3 inputs the ground potential GND to an inversion input terminal and inputs the voltage at the first intermediate point N1 to a non-inversion input terminal. By such a configuration, though the number of elements increases compared to the configuration in FIG. 2, when the voltage at the first intermediate point N1 is about to exceed the ground potential GND, the PMOS transistor M3a limits the current, and the voltage at the first intermediate point N1 can be clamped to be lower than the ground potential GND.

The above embodiments show examples in which the negative voltage control signals Va1, Va2 and Va3 are generated at the first intermediate point N1 in the embodiment 1, the connection point Na in the embodiment 2 and the second intermediate point N2 in the embodiment 3. However, the negative voltage control signal may be generated at other connection points on the basis of the voltages at the respective points. The details shown in the embodiments, such as specific configurations of the voltage current conversion circuit, the current source, the second clamp circuit and the current mirror, may be appropriately modified within the scope of the present invention.

The entire disclosure of Japanese Patent Application No. 2017-128264 filed on Jun. 30, 2017 including description, claims, drawings, and abstract are incorporated herein by reference in its entirety.

What is claimed is:

1. A negative power supply control circuit which controls a negative voltage regulator circuit based on a positive voltage control signal, the negative power supply control circuit comprising:

a control signal input terminal to which the positive voltage control signal is input;

a negative voltage input terminal to which a negative power supply voltage is input;

a negative voltage control signal output terminal to which a negative voltage control signal is output;

a voltage current conversion circuit which causes a current to flow based on the positive voltage control signal;

a first current source which is connected in series with the voltage current conversion circuit, and is able to draw a current into the negative voltage input terminal; and a first clamp circuit which is connected in series with the voltage current conversion circuit and the first current source, and connected between the voltage current conversion circuit and the first current source, wherein:

the voltage current conversion circuit, the first clamp circuit, and the first current source are connected in series between the control signal input terminal and the negative voltage input terminal, the first clamp circuit clamps a voltage at a first intermediate point between the first clamp circuit and the first current source by limiting a current flowing in the first clamp circuit according to the voltage at the first intermediate point in a period when a current flows in the voltage current conversion circuit, the negative voltage control signal is generated based on a voltage or a current in a current path through the voltage current conversion circuit, the first clamp circuit and the first current source, and the first clamp circuit is an NMOS transistor which has a gate connected to a ground potential, a drain connected to the voltage current conversion circuit, and a source and a back gate connected to the first intermediate point.

2. A negative power supply control circuit which controls a negative voltage regulator circuit based on a positive voltage control signal, the negative power supply control circuit comprising:

a control signal input terminal to which the positive voltage control signal is input;

a negative voltage input terminal to which a negative power supply voltage is input;

a negative voltage control signal output terminal to which a negative voltage control signal is output;

a voltage current conversion circuit which causes a current to flow based on the positive voltage control signal;

a first current source which is connected in series with the voltage current conversion circuit, and is able to draw a current into the negative voltage input terminal; and a first clamp circuit which is connected in series with the voltage current conversion circuit and the first current source, and connected between the voltage current conversion circuit and the first current source, wherein:

the voltage current conversion circuit, the first clamp circuit, and the first current source are connected in series between the control signal input terminal and the negative voltage input terminal, the first clamp circuit clamps a voltage at a first intermediate point between the first clamp circuit and the first current source by limiting a current flowing in the first clamp circuit according to the voltage at the first intermediate point in a period when a current flows in the voltage current conversion circuit, the negative voltage control signal is generated based on a voltage or a current in a current path through the voltage current conversion circuit, the first clamp circuit and the first current source, and the negative power supply control circuit further comprises a second clamp circuit which clamps the voltage at the first intermediate point to a voltage higher than the negative power supply voltage in a period when a current does not flow in the first current source.

3. The negative power supply control circuit which controls a negative voltage regulator circuit based on a positive voltage control signal, the negative power supply control circuit comprising:

a control signal input terminal to which the positive voltage control signal is input;

a negative voltage input terminal to which a negative power supply voltage is input;

a negative voltage control signal output terminal to which a negative voltage control signal is output;

a voltage current conversion circuit which causes a current to flow based on the positive voltage control signal;

a first current source which is connected in series with the voltage current conversion circuit, and is able to draw a current into the negative voltage input terminal; and a first clamp circuit which is connected in series with the voltage current conversion circuit and the first current source, and connected between the voltage current conversion circuit and the first current source, wherein:

the voltage current conversion circuit, the first clamp circuit, and the first current source are connected in series between the control signal input terminal and the negative voltage input terminal, the first clamp circuit clamps a voltage at a first intermediate point between the first clamp circuit and the first current source by limiting a current flowing in the first clamp circuit according to the voltage at the first intermediate point in a period when a current flows in the voltage current conversion circuit, the negative voltage control signal is generated based on a voltage or a current in a current path through the voltage current conversion circuit, the first clamp circuit and the first current source, the negative power supply control circuit further comprises:

a second current source which causes a current to flow from a ground potential to the negative voltage input terminal;

a first current mirror which is able to transfer a current of the second current source and cause a current to flow to a second intermediate point between the ground potential and the negative voltage input terminal; and a second current mirror which is able to transfer a current flowing in the voltage current conversion circuit, the first clamp circuit and the first current source, and draw a current from the second intermediate point, and the negative voltage control signal output terminal is the second intermediate point.

4. The negative power supply control circuit according to claim 1, wherein a discharge switch of an output capacitor included in the negative voltage regulator circuit is controlled.

5. A power supply device comprising:

the negative power supply control circuit according to claim 1; and a negative voltage regulator circuit which is controlled by the negative voltage control signal of the negative power supply control circuit.

6. The negative power supply control circuit according to claim 2, wherein a discharge switch of an output capacitor included in the negative voltage regulator circuit is controlled.

7. A power supply device comprising:
   the negative power supply control circuit according to claim 2; and
   a negative voltage regulator circuit which is controlled by the negative voltage control signal of the negative power supply control circuit.

8. The negative power supply control circuit according to claim 3, wherein a discharge switch of an output capacitor included in the negative voltage regulator circuit is controlled.

9. A power supply device comprising:
   the negative power supply control circuit according to claim 3; and
   a negative voltage regulator circuit which is controlled by the negative voltage control signal of the negative power supply control circuit.

* * * * *

UNITED STATES PATENT AND TRADEMARK OFFICE
CERTIFICATE OF CORRECTION

PATENT NO. : 10,296,034 B2  
APPLICATION NO. : 16/020948  
DATED : May 21, 2019  
INVENTOR(S) : Kohei Sakurai and Yoichi Takano Page 1 of 1

It is certified that error appears in the above-identified patent and that said Letters Patent is hereby corrected as shown below:

On the Title Page

Column 2, item (57) under "ABSTRACT", Line 4, delete "terminal" and insert --terminal;--.

Column 2, item (57) under "ABSTRACT", Line 5, after "voltage" delete "input".

Column 2, item (57) under "ABSTRACT", Line 6, delete "conversation" and insert --conversion--.

Column 2, item (57) under "ABSTRACT", Line 12, delete "conversation" and insert --conversion--.

Column 2, item (57) under "ABSTRACT", Line 13, delete "controls" and insert --control--.

Column 2, item (57) under "ABSTRACT", Line 15, delete "conversation" and insert --conversion--.

Signed and Sealed this  
Fifteenth Day of October, 2019

Andrei Iancu  
*Director of the United States Patent and Trademark Office*